United States Patent
Tanimura et al.

(10) Patent No.: US 10,643,850 B2
(45) Date of Patent: May 5, 2020

(54) DOPANT INTRODUCTION METHOD AND THERMAL TREATMENT METHOD

(71) Applicant: SCREEN HOLDINGS CO., LTD., Kyoto-shi, Kyoto (JP)

(72) Inventors: Hideaki Tanimura, Kyoto (JP); Takayuki Aoyama, Kyoto (JP); Kazuhiko Fuse, Kyoto (JP); Takahiro Yamada, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 35 days.

(21) Appl. No.: 15/815,219

(22) Filed: Nov. 16, 2017

(65) Prior Publication Data

US 2018/0144939 A1 May 24, 2018

(30) Foreign Application Priority Data

Nov. 18, 2016 (JP) ................................ 2016-225101

(51) Int. Cl.
*H01L 21/22* (2006.01)
*H01L 21/26* (2006.01)
(Continued)

(52) U.S. Cl.
CPC ...... *H01L 21/2255* (2013.01); *H01L 21/2686* (2013.01); *H01L 21/324* (2013.01);
(Continued)

(58) Field of Classification Search
CPC ............. H01L 21/2255; H01L 21/2686; H01L 21/324; H01L 21/67115
(Continued)

(56) References Cited

U.S. PATENT DOCUMENTS 4,102,715 A * 7/1978 Kambara ............ H01L 21/2255
148/DIG. 112
4,410,375 A * 10/1983 Sawada ............... H01L 21/2255
257/E21.149
(Continued)

FOREIGN PATENT DOCUMENTS

JP 05-121682 A 5/1993
JP 05121682 A * 5/1993
(Continued)

OTHER PUBLICATIONS

Taiwanese Office Action issued in corresponding Taiwanese Patent Application No. 106136479, dated Jan. 30, 2019, with partial English Translation of the Japanese Translation of the Taiwanese Office Action.
(Continued)

*Primary Examiner* — Sheikh Maruf
(74) *Attorney, Agent, or Firm* — McDermott Will & Emery LLP

(57) ABSTRACT

A PSG film, which is a silicon dioxide thin film containing phosphorus as a dopant, is formed on the surface of a semiconductor wafer. The semiconductor wafer having the PSG film formed thereon is kept at a predetermined heating temperature by light radiation from halogen lamps in the atmosphere containing hydrogen for 1 second or longer, so that the dopant is diffused from the PSG film into the surface of the semiconductor wafer. In addition, the flashing light is radiated to the semiconductor wafer for the radiation time shorter than 1 second to heat the surface of the semiconductor wafer to the target temperature so as to activate the dopant. When the PSG film is heated in the atmosphere containing hydrogen, a diffusion coefficient of the dopant contained in the PSG film becomes high; therefore, the
(Continued)

dopant can be efficiently diffused from the PSG film into the semiconductor wafer.

4 Claims, 13 Drawing Sheets

(51) Int. Cl.
    *H01L 21/68*     (2006.01)
    *H01L 21/225*     (2006.01)
    *H01L 21/268*     (2006.01)
    *H01L 21/687*     (2006.01)
    *H01L 21/324*     (2006.01)
    *H01L 21/67*     (2006.01)

(52) U.S. Cl.
    CPC .... *H01L 21/67115* (2013.01); *H01L 21/6875* (2013.01); *H01L 21/68735* (2013.01)

(58) Field of Classification Search
    USPC .......................................................... 438/563
    See application file for complete search history.

(56) References Cited

U.S. PATENT DOCUMENTS

| | | | | |
|---|---|---|---|---|
| 4,544,418 | A * | 10/1985 | Gibbons | H01L 21/02129 117/88 |
| 5,173,440 | A * | 12/1992 | Tsunashima | H01L 21/2255 148/DIG. 14 |
| 5,827,764 | A * | 10/1998 | Liaw | H01L 21/28512 438/238 |
| 6,921,708 | B1 * | 7/2005 | Sharan | H01L 21/28518 257/E21.165 |
| 2003/0013280 | A1 * | 1/2003 | Yamanaka | C23C 16/24 438/487 |
| 2003/0148561 | A1 * | 8/2003 | Nakajima | H01L 21/02422 438/151 |
| 2004/0023472 | A1 * | 2/2004 | Niwayama | H01L 21/324 438/542 |
| 2005/0136604 | A1 * | 6/2005 | Al-Bayati | H01J 37/321 438/301 |
| 2005/0230047 | A1 * | 10/2005 | Collins | H01J 37/32082 156/345.33 |
| 2006/0228868 | A1 * | 10/2006 | Ahn | C23C 16/405 438/453 |
| 2006/0264060 | A1 * | 11/2006 | Ramaswamy | C23C 16/26 438/758 |
| 2006/0264063 | A1 * | 11/2006 | Stern | C23C 16/345 438/776 |
| 2007/0087574 | A1 * | 4/2007 | Gupta | H01J 37/32412 438/758 |
| 2007/0286954 | A1 * | 12/2007 | Tang | C23C 16/26 427/249.1 |
| 2008/0190909 | A1 * | 8/2008 | Yokouchi | F27B 5/18 219/385 |
| 2008/0280424 | A1 * | 11/2008 | Yamazaki | H01L 27/1266 438/480 |
| 2008/0299744 | A1 * | 12/2008 | Yamazaki | H01L 21/76254 438/458 |
| 2009/0004836 | A1 * | 1/2009 | Singh | H01J 37/321 438/513 |
| 2009/0067823 | A1 * | 3/2009 | Kusuda | H01L 21/67115 392/418 |
| 2009/0098709 | A1 * | 4/2009 | Ohnuma | H01L 21/76254 438/458 |
| 2009/0115029 | A1 * | 5/2009 | Koyama | H01L 21/76254 257/632 |
| 2009/0203197 | A1 * | 8/2009 | Hanawa | C23C 16/45536 438/513 |
| 2009/0311840 | A1 * | 12/2009 | Onizawa | H01L 21/268 438/287 |
| 2011/0033999 | A1 * | 2/2011 | Kono | H01L 21/2225 438/305 |
| 2014/0008727 | A1 * | 1/2014 | Loo | H01L 21/2254 257/347 |
| 2015/0206751 | A1 * | 7/2015 | Kato | H01L 21/228 438/542 |
| 2015/0340541 | A1 * | 11/2015 | Koehler | C30B 31/04 136/256 |
| 2018/0033626 | A1 * | 2/2018 | Liao | H01L 29/785 |
| 2018/0076061 | A1 * | 3/2018 | Fuse | H01L 21/22 |

FOREIGN PATENT DOCUMENTS

| | | |
|---|---|---|
| JP | 2007-201337 A | 8/2007 |
| JP | 2016-184670 A | 10/2016 |
| KR | 10-0153772 B1 | 12/1998 |
| TW | 200941585 A | 10/2009 |
| WO | 2016/151937 A1 | 9/2016 |

OTHER PUBLICATIONS

Korean Notification of Reason for Refusal issued in corresponding Korean Patent Application No. 10-2017-0152246, dated Mar. 27, 2019, with English Translation.
Korean Decision to Grant issued in corresponding Korean Patent Application No. 10-2017-0152246, dated Aug. 14, 2019 (Translation not available in Global Dossier).

* cited by examiner

F I G. 6
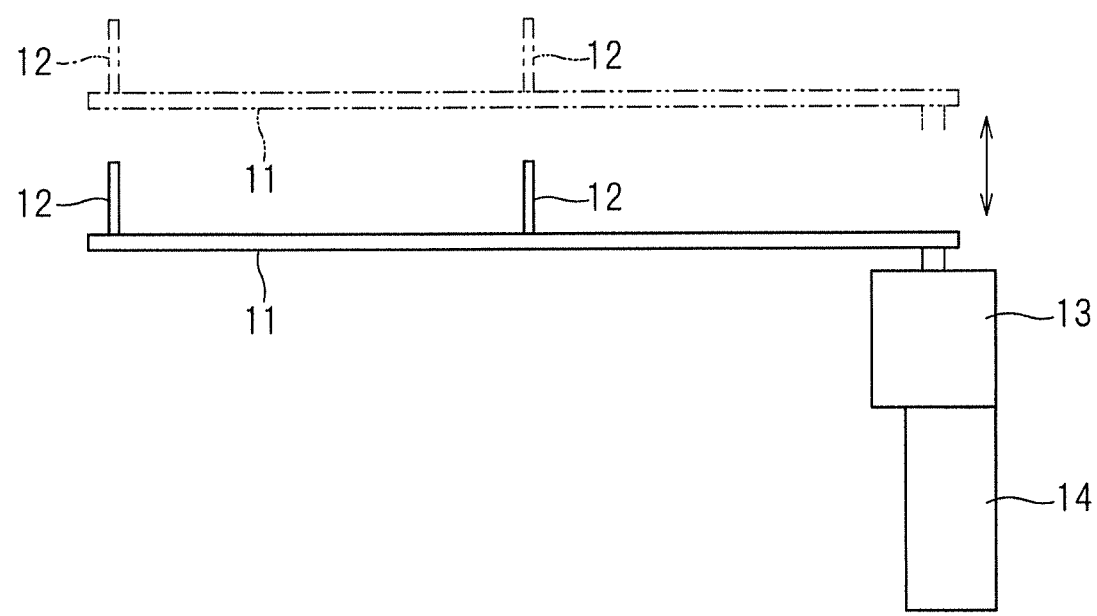

F I G. 7
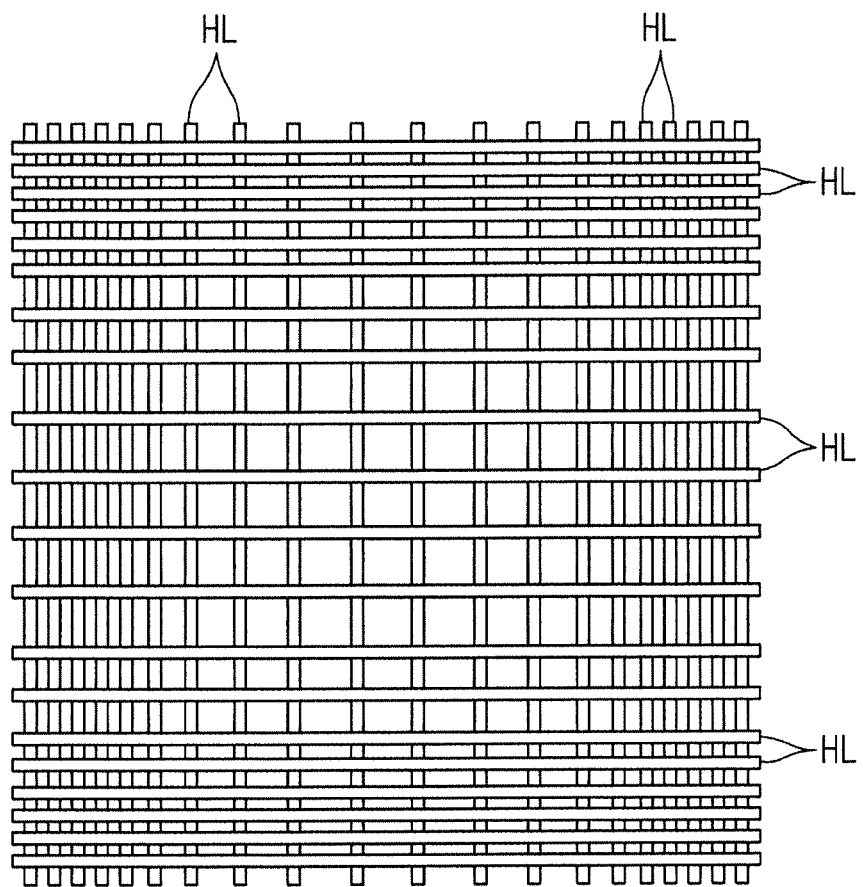

F I G. 9
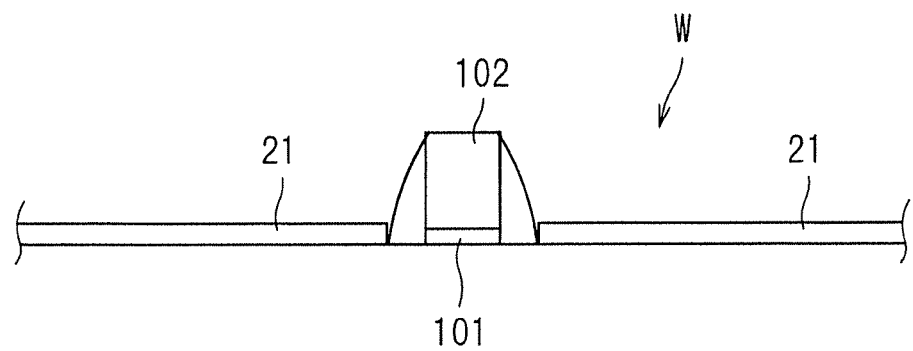

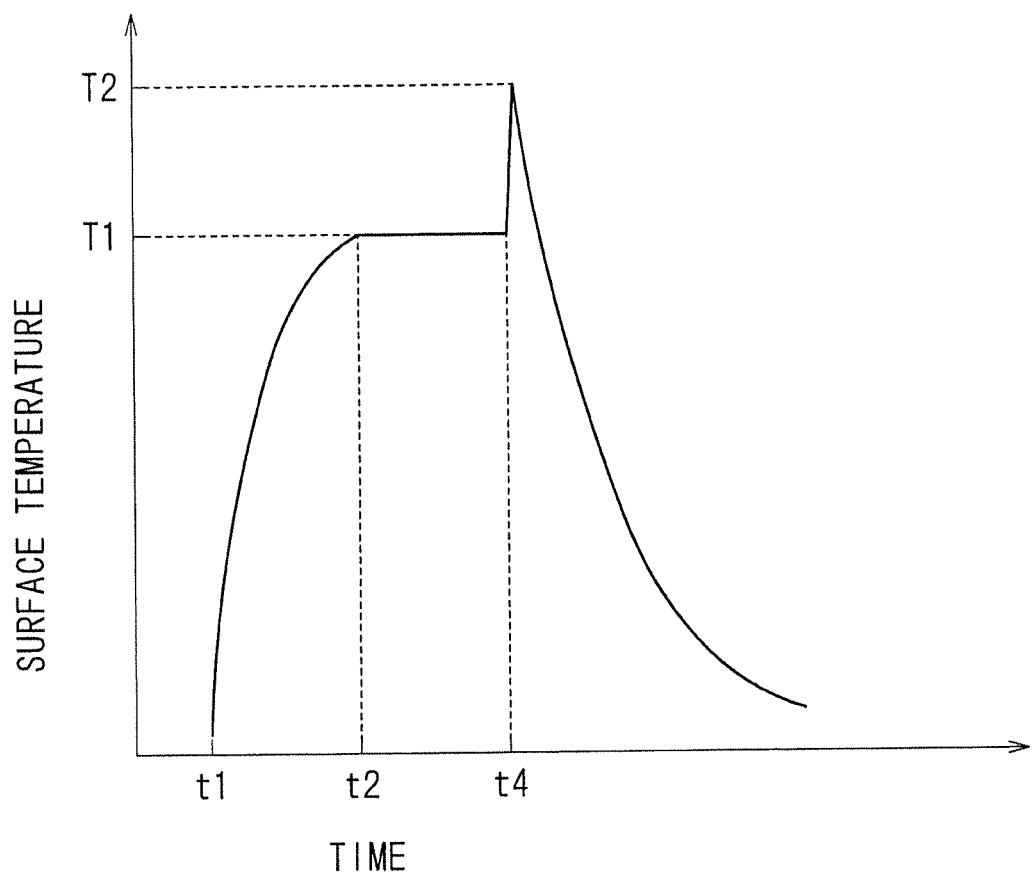
F I G . 1 3

DOPANT INTRODUCTION METHOD AND THERMAL TREATMENT METHOD

BACKGROUND OF THE INVENTION

Field of the Invention

The present invention relates to a dopant introduction method and a thermal treatment method by which a dopant is introduced into a semiconductor substrate and is activated.

Description of the Background Art

Introducing a dopant into single crystal silicon or germanium is an essential process in a fabrication process of semiconductor devices. A dopant is introduced to form an n-type semiconductor or a p-type semiconductor. The introduction of a dopant is typically realized by ion implanting dopant atoms such as boron (B), arsenic (As), and phosphorus (P) into a semiconductor substrate such as germanium and by performing an annealing treatment on the semiconductor substrate to activate the dopant atoms.

Further, in recent years, various efforts have been made to improve device performances by converting a conventional planar device structure into a three-dimensional structure (for example, Fin FET and the like). In the case of the three-dimensional structure as described above, it is difficult to implant a dopant into a place requiring the dopant in some cases by the ion implant method, which is conventionally a mainstream. To address this issue, there is proposed another dopant introduction technology different from the ion implant technology. In this alternate dopant introduction technology, a thin oxide film to which a dopant such as boron or phosphorus is added (PSG film, BSG film, and the like) is formed on a semiconductor substrate, and an annealing treatment is performed on the thin oxide film to diffuse the dopant atoms in the semiconductor from the thin oxide film (for example, Japanese Patent Application Laid-Open No. 2007-201337 and the like).

On the other hand, with the progress of the semiconductor technology, a process with a smaller thermal budget is required, and a mainstream is a thermal treatment process in an extremely short time such as millisecond order or a nanosecond order. With a short time and low thermal budget process, the diffusion length of a dopant in a PSG film or the like is shorter, and as a result, there is a problem that it is impossible to diffuse sufficient dopant in a semiconductor.

SUMMARY OF THE INVENTION

The present invention is directed to a dopant introduction method by which a dopant is introduced into a semiconductor substrate and is then activated.

In an aspect of the present invention, a dopant introduction method includes the steps of: (a) forming on a surface of a semiconductor substrate a silicon dioxide film containing a dopant; (b) keeping the semiconductor substrate at a first temperature in an atmosphere containing hydrogen for 1 second or longer to diffuse the dopant into a surface of the semiconductor substrate from the silicon dioxide film containing the dopant; and (c) irradiating in the atmosphere containing hydrogen the semiconductor substrate with flashing light for a radiation time less than 1 second to heat the surface of the semiconductor substrate at a second temperature to activate the dopant.

In the atmosphere containing hydrogen, a diffusion coefficient of the dopant in the silicon dioxide is high, and the dopant can be efficiently diffused into the semiconductor substrate.

It is preferable that after step (b) is performed, the semiconductor substrate be cooled to a third temperature lower than the first temperature, and then step (c) be performed.

A thermal budget of the whole thermal treatment processing is small, and the dopant is thus prevented from being excessively diffused into the semiconductor substrate in step (c).

The present invention is also directed to a thermal treatment method of a semiconductor substrate.

In an aspect of the present invention, a thermal treatment method includes the steps of: (a) keeping a semiconductor substrate, on a surface of which a silicon dioxide film containing a dopant is formed, in an atmosphere containing hydrogen at a first temperature for 1 second or longer to diffuse the dopant into the surface of the semiconductor substrate from the silicon dioxide film; and (b) irradiating, in the atmosphere containing hydrogen, the semiconductor substrate with flashing light for a radiation time less than 1 second to heat the surface of the semiconductor substrate at a second temperature to activate the dopant.

In the atmosphere containing hydrogen, a diffusion coefficient of the dopant in the silicon dioxide is high, and the dopant can be efficiently diffused into the semiconductor substrate.

Therefore, an object of the present invention is to efficiently diffuse a dopant into a semiconductor substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a side view of the transfer mechanism;

FIG. 7 is a plan view showing an arrangement of a plurality of halogen lamps;

FIG. 9 is a diagram schematically showing a structure of a surface of a semiconductor wafer on which a silicon dioxide thin film containing a dopant is formed;

FIG. 13 is a diagram showing a change in a surface temperature of a semiconductor wafer in a third preferred embodiment.

DESCRIPTION OF THE PREFERRED EMBODIMENTS

Hereinafter, a preferred embodiments of the present invention will be described in detail with reference to the drawings.

First Preferred Embodiment

Figure 1:
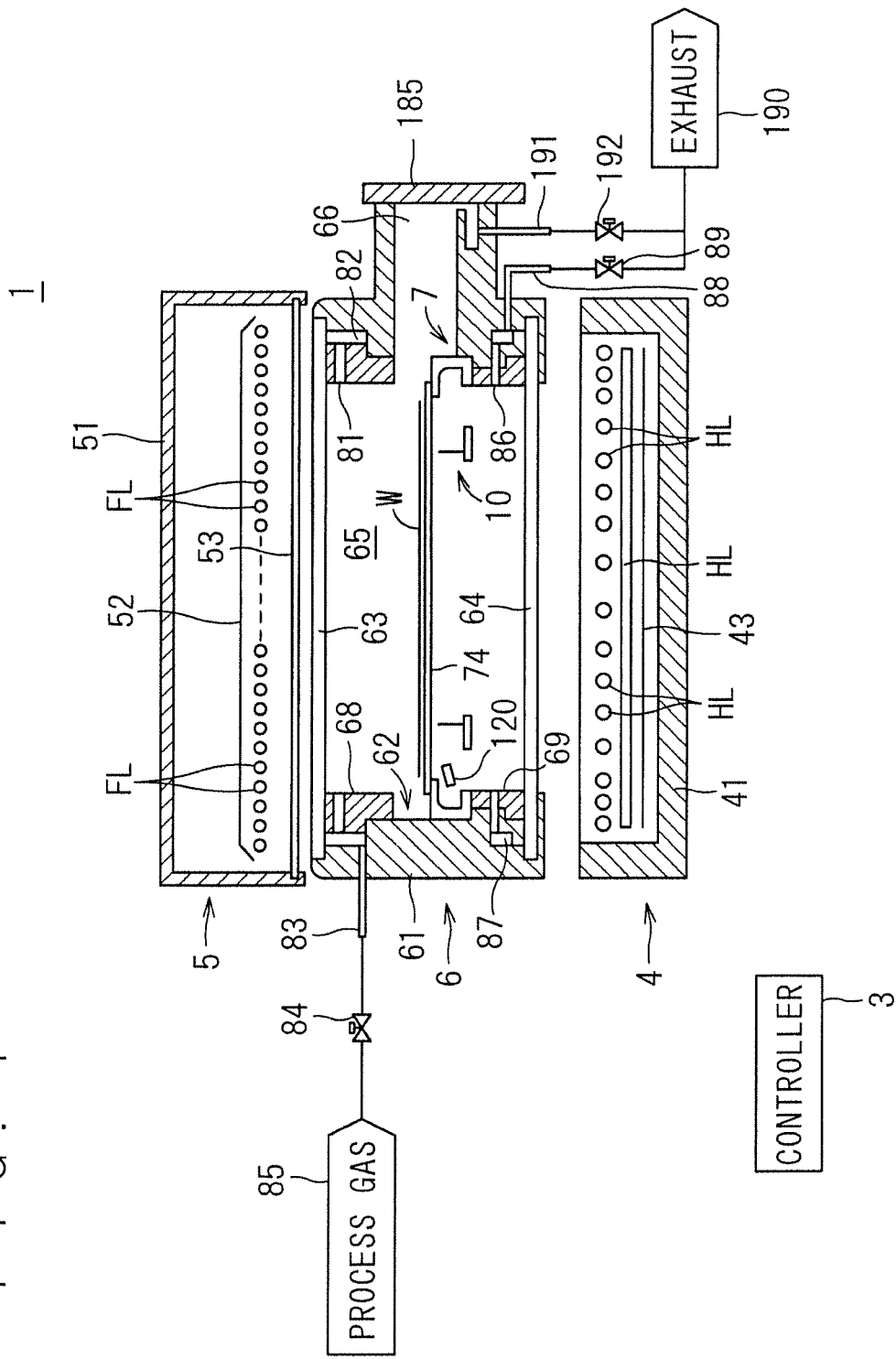
FIG. 1 is a vertical sectional view showing a configuration of a thermal treatment apparatus used in a dopant introduction method according to the present invention.

First, a thermal treatment apparatus will be described which performs a thermal treatment necessary to perform a dopant introduction method according to the present invention. FIG. 1 is a vertical sectional view showing a configuration of a thermal treatment apparatus 1 used for the dopant introduction method according to the present invention. The thermal treatment apparatus 1 of FIG. 1 is a flash lamp annealing apparatus which radiates flashing light to a disc-shaped semiconductor wafer W as a substrate to heat the semiconductor wafer W. The size of the semiconductor wafer W as a treatment object is not particularly limited but is a diameter of 300 mm or 450 mm, for example. Note that in FIG. 1 or other following drawings, sizes and numbers of the parts are exaggerated or simplified, if necessary, for easy understanding.

The thermal treatment apparatus 1 is equipped with a chamber 6 which houses the semiconductor wafer W, a flash heating unit 5 containing a plurality of flash lamps FL, and a halogen heating unit 4 containing a plurality of halogen lamps HL. The flash heating unit 5 is provided on the upper side of the chamber 6, and the halogen heating unit 4 is provided on the lower side. The thermal treatment apparatus 1 is further equipped with: a holding member 7 which holds the semiconductor wafer W in a horizontal posture in the chamber 6; and a transfer mechanism 10 which transfers the semiconductor wafer W between the holding member 7 and the outside of the apparatus. The thermal treatment apparatus 1 is further equipped with a controller 3 which controls various operation mechanisms provided on the halogen heating unit 4, the flash heating unit 5, and the chamber 6 such that the thermal treatment of the semiconductor wafer W is performed.

The chamber 6 is configured with a chamber side part 61 and chamber windows made of quartz; and each of the chamber windows is attached on each of the upper side and the lower side of the chamber side part 61. The chamber side part 61 has an approximately cylindrical shape having openings on the upper side and the lower side, an upper chamber window 63 is attached on the upper opening to close the opening, and a lower chamber window 64 is attached on the lower opening to close the opening. The upper chamber window 63 constituting a ceiling part of the chamber 6 is a disc-shaped member made of quartz and functions as a quartz window which transmits flashing light emitted from the flash heating unit 5 into the chamber 6. The lower chamber window 64 constituting a floor part of the chamber 6 is also a disc-shaped member made of quartz and functions as a quartz window which transmits light from the halogen heating unit 4 into the chamber 6.

Further, at an upper part of an inner side wall surface of the chamber side part 61, there is attached a reflection ring 68; and on the lower part, there is attached a reflection ring 69. The reflection rings 68 and 69 are both formed in a ring shape. The reflection ring 68 on the upper side is attached by being inserted from the upper side of the chamber side part 61. On the other hand, the reflection ring 69 on the lower side is attached by being inserted from the lower side of the chamber side part 61 and being fixed by a bolt (not shown).

That is, the reflection rings 68 and 69 are both detachably attached on the chamber side part 61. The inner space of the chamber 6, in other words, the space surrounded by the upper chamber window 63, the lower chamber window 64, the chamber side part 61, and the reflection rings 68 and 69 is defined as a thermal treatment space 65.

By attaching the reflection rings 68 and 69 on the chamber side part 61, a recessed part 62 is formed on an inner wall surface of the chamber 6. That is, the recessed part 62 is formed to be surrounded by (i) the center part which is of the inner wall surface of the chamber side part 61 and on which the reflection ring 68 or 69 is not attached, (ii) the lower end face of the reflection ring 68, and (iii) the upper end face of the reflection ring 69. The recessed part 62 is formed in a ring shape on the inner wall surface of the chamber 6 along the horizontal direction and encircles the holding member 7 which holds the semiconductor wafer W. The chamber side part 61 and the reflection rings 68 and 69 are made of a metal material (for example, stainless steel) excellent in strength and heat resistance.

Further, in the chamber side part 61, there is formed a conveyance opening (furnace opening) 66 through which the semiconductor wafer W is conveyed in and out of the chamber 6. The conveyance opening 66 can be opened and closed by a gate valve 185. The conveyance opening 66 is communicated with the outer circumferential surface of the recessed part 62. With this arrangement, when the gate valve 185 opens the conveyance opening 66, the semiconductor wafer W can be conveyed into the thermal treatment space 65 from the conveyance opening 66 through the recessed part 62 and can be conveyed out of the thermal treatment space 65. When the gate valve 185 closes the conveyance opening 66, the thermal treatment space 65 of the chamber 6 becomes a sealed space.

Further, in the upper part of the inner wall of the chamber 6, there is formed a gas supply hole 81 through which a process gas is supplied to the thermal treatment space 65. The gas supply hole 81 is provided at a position higher than the recessed part 62 and may be provided in the reflection ring 68. The gas supply hole 81 is communicated with a gas supply pipe 83 through a buffer space 82 formed, in a ring shape, in the side wall of the chamber 6. The gas supply pipe 83 is connected to a process gas supply source 85. Further, on the path of the gas supply pipe 83, there is inserted a valve 84. When the valve 84 is opened, a process gas is supplied to the buffer space 82 from the process gas supply source 85. The process gas flowing into the buffer space 82 flows in the buffer space 82 as if spreading, which has a lower fluid resistance than the gas supply hole 81, and is supplied from the gas supply hole 81 to the thermal treatment space 65. As a process gas, there may be used, for example, an inert gas such as nitrogen ($N_2$), a reactive gas such as hydrogen ($H_2$) or ammonia ($NH_3$), or a mixed gas prepared by mixing these gases (in the present preferred embodiment, a mixed gas of nitrogen gas and hydrogen gas is used).

On the other hand, in the lower part of the inner wall of the chamber 6, there is formed a gas exhaust hole 86 for discharging a gas in the thermal treatment space 65. The gas exhaust hole 86 is formed at a position lower than the recessed part 62 and may be provided in the reflection ring 69. The gas exhaust hole 86 is communicated with a gas exhaust pipe 88 through a buffer space 87 formed, in a ring shape, in the side wall of the chamber 6. The gas exhaust pipe 88 is connected to an exhaust unit 190. Further, on the path of the gas exhaust pipe 88, there is inserted a valve 89. When the valve 89 is opened, the gas in the thermal treatment space 65 is discharged from the gas exhaust hole 86 through the buffer space 87 to the gas exhaust pipe 88. Note that, a plurality of the gas supply holes 81 and a plurality of the gas exhaust holes 86 may be provided along the circumferential direction of the chamber 6, or the gas supply hole 81 and the gas exhaust hole 86 may be made in a slit shape. Further, the process gas supply source 85 and the exhaust unit 190 may be mechanisms provided on the thermal treatment apparatus 1 or may be utilities of a factory in which the thermal treatment apparatus 1 is installed.

In addition, also at the end of the conveyance opening 66, there is connected a gas exhaust pipe 191 for discharging the gas in the thermal treatment space 65. The gas exhaust pipe 191 is connected to the exhaust unit 190 through a valve 192. When the valve 192 is opened, the gas in the chamber 6 is discharged through the conveyance opening 66.

Figure 2:
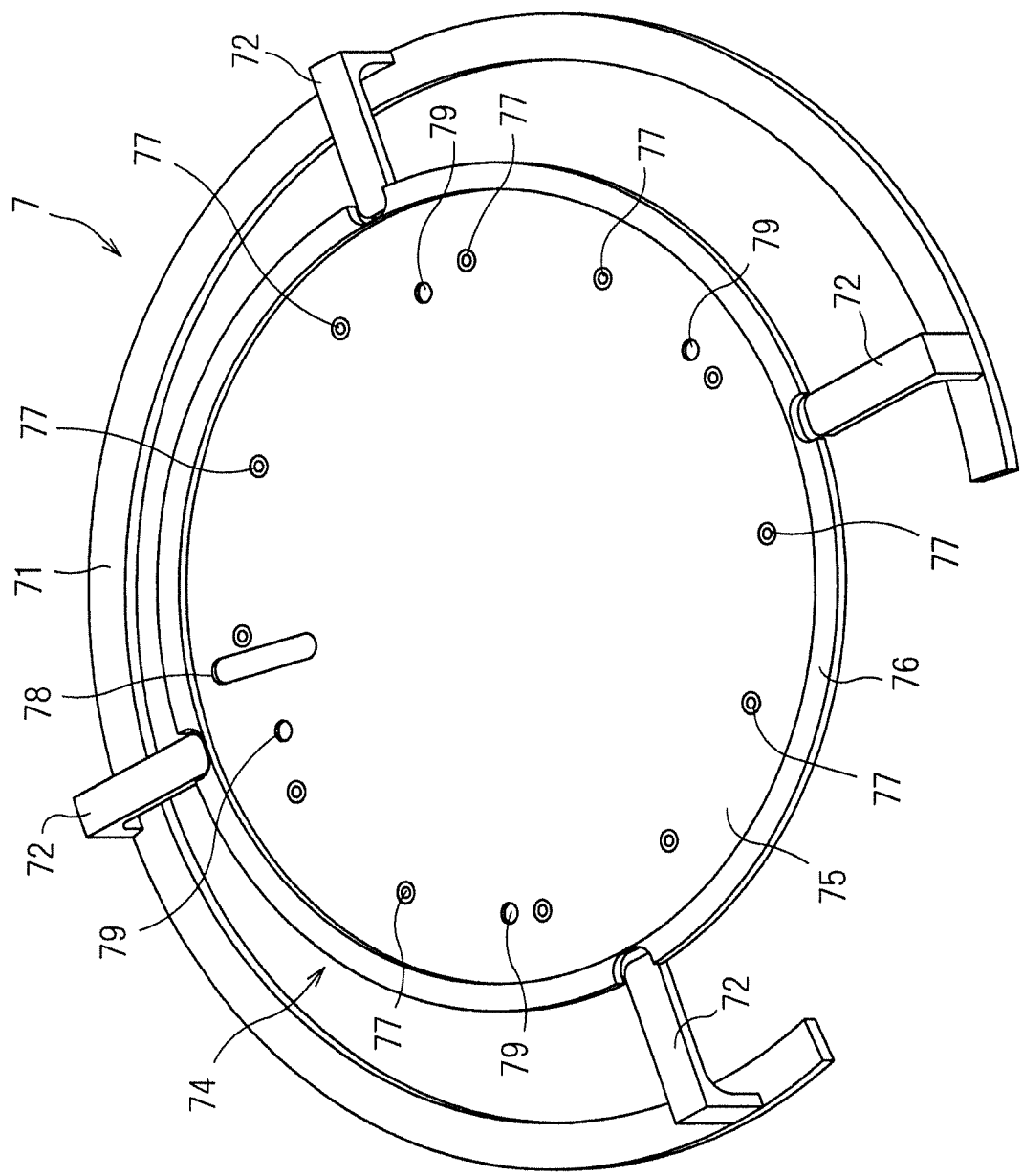
FIG. 2 is a perspective view showing whole of an outer appearance of a holding member.

FIG. 2 is a perspective view showing whole of an outer appearance of the holding member 7. The holding member 7 is configured with a base ring 71, coupling members 72, and a susceptor 74. The base ring 71, the coupling members 72, and the susceptor 74 are each made of quartz. That is, the holding member 7 is entirely made of quartz.

The base ring 71 is a quartz member which has a ring shape with a missing part. The missing part is provided to prevent transfer arms 11 of the transfer mechanism 10 (to be described later) and the base ring 71 from interfering each other. The base ring 71 is placed on the bottom surface of the recessed part 62; thus, the base ring 71 is supported by the wall surface of the chamber 6 (see FIG. 1). The plurality of the coupling members 72 (four members in the present preferred embodiment) are vertically provided on the upper surface of the base ring 71 along the circumferential direction of the ring shape of the base ring 71. The coupling members 72 are also made of quartz and are fixed on the base ring 71 by welding.

Figure 3:
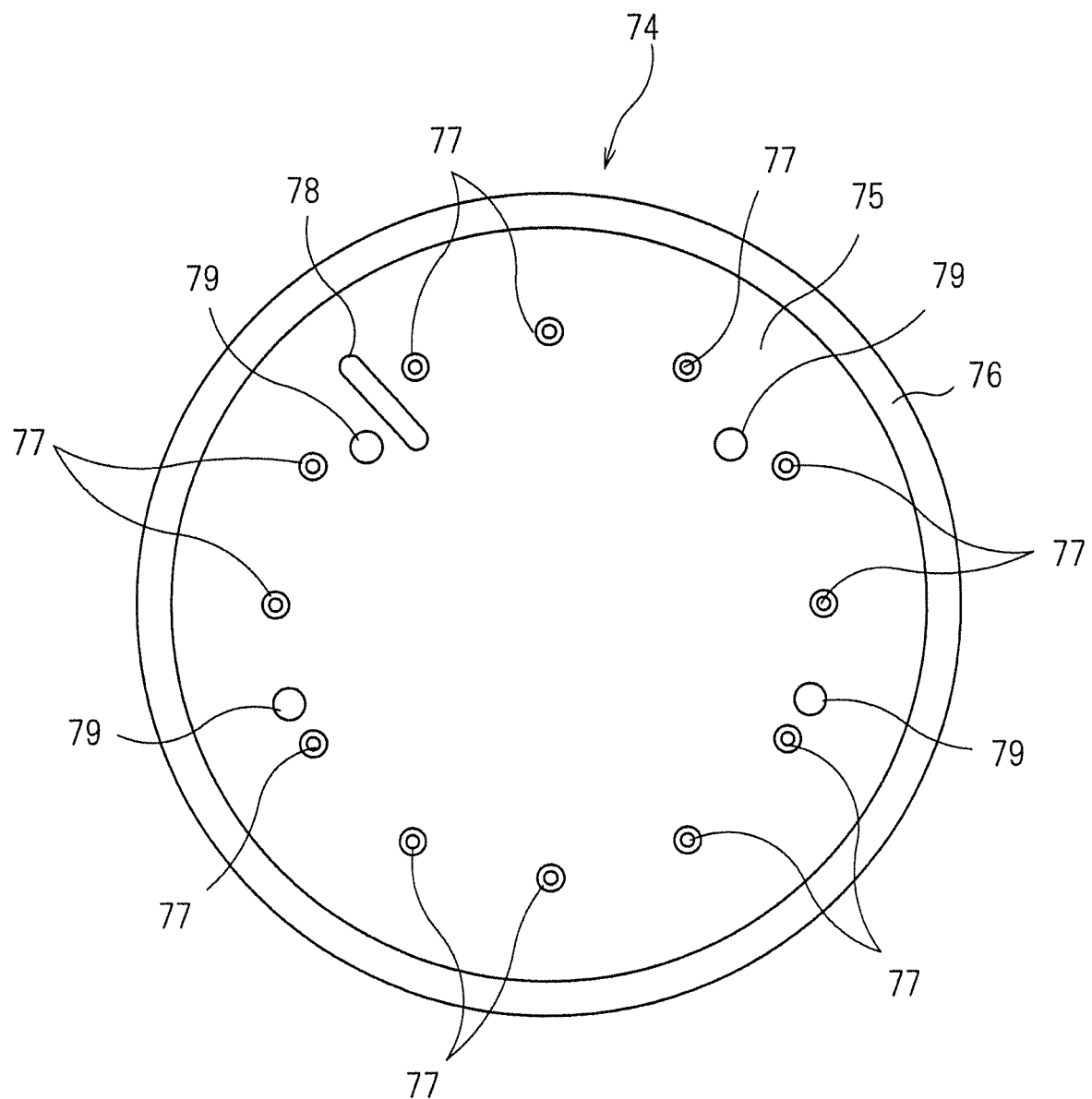
FIG. 3 is a plan view of a susceptor.
Figure 4:
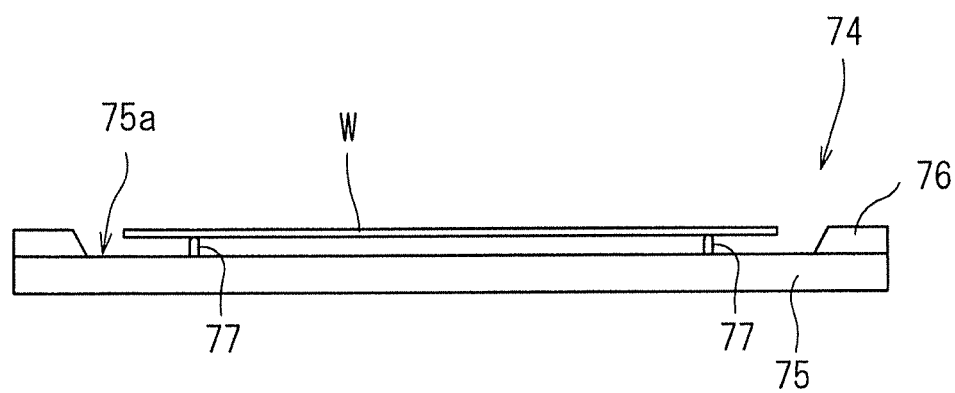
FIG. 4 is a sectional view of the susceptor.

The susceptor 74 are supported by the four coupling members 72 provided on the base ring 71. FIG. 3 is a plan view of the susceptor 74. Further, FIG. 4 is a sectional view of the susceptor 74. The susceptor 74 is equipped with a holding plate 75, a guide ring 76, and a plurality of substrate support pins 77. The holding plate 75 is a flat plate member made of quartz in an approximately circular shape. The holding plate 75 has a diameter larger than the diameter of the semiconductor wafer W. That is, the holding plate 75 has a larger plane size than the semiconductor wafer W.

On the upper surface peripheral edge part of the holding plate 75, the guide ring 76 is provided. The guide ring 76 is a member in a ring shape and has an inner diameter larger than the diameter of the semiconductor wafer W. For example, for the semiconductor wafer W having a diameter of 300 mm, the inner diameter of the guide ring 76 is 320 mm. The inner periphery of the guide ring 76 has a tapered surface being wider upward from the holding plate 75. The guide ring 76 is made of quartz similarly to the holding plate 75. The guide ring 76 may be welded on the upper surface of the holding plate 75 or may be fixed on the holding plate 75 with a separately processed pin or the like. Alternatively, the holding plate 75 and the guide ring 76 may be processed as an integral member.

The area which is of the upper surface of the holding plate 75 and is on the inside of the guide ring 76 is a flat holding surface 75a for holding the semiconductor wafer W. In the holding surface 75a of the holding plate 75, there are vertically provided a plurality of substrate support pins 77. In the present preferred embodiment, the totally 12 substrate support pins 77 are vertically provided every 30 degrees along the perimeter of a circle concentric with the outer peripheral circle of the holding surface 75a (the inner peripheral circle of the guide ring 76). The diameter of the circle on which the 12 substrate support pins 77 are provided (the distance between the opposite substrate support pins 77) is smaller than the diameter of the semiconductor wafer W, and is 270 mm to 280 mm (280 mm in the present preferred embodiment) for the semiconductor wafer W having a diameter of 300 mm. The substrate support pins 77 are formed of quartz. The substrate support pins 77 may be provided on the upper surface of the holding plate 75 by welding or may be processed integrally with the holding plate 75.

Referring back to FIG. 2, the four coupling members 72 vertically provided on the base ring 71 and the peripheral edge part of the holding plate 75 of the susceptor 74 are fixed to each other by welding. That is, the susceptor 74 and the base ring 71 are fixedly connected with the coupling members 72. The base ring 71 of the holding member 7 described above is supported by the wall surface of the chamber 6; thus, the holding member 7 is mounted on the chamber 6. When the holding member 7 is being mounted on the chamber 6, the holding plate 75 of the susceptor 74 is in a horizontal posture (the posture in which the normal line is coincident with the vertical line). That is, the holding surface 75a of the holding plate 75 is a horizontal plane.

The semiconductor wafer W conveyed into the chamber 6 is placed in a horizontal posture on the susceptor 74 of the holding member 7 mounted on the chamber 6 and is held. In this state, the semiconductor wafer W is held by the susceptor 74, being supported by the 12 substrate support pins 77 vertically provided on the holding plate 75. More precisely, the upper end parts of the 12 substrate support pins 77 are in contact with the lower surface of the semiconductor wafer W to support the semiconductor wafer W. The heights of the 12 substrate support pins 77 (the distances between the upper ends of the substrate support pins 77 to the holding surface 75a of the holding plate 75) are identical; therefore, the semiconductor wafer W can be supported in a horizontal posture by the 12 substrate support pins 77.

In addition, the semiconductor wafer W is supported by the substrate support pins 77, being apart from the holding surface 75a of the holding plate 75 with a predetermined distance therebetween. The thickness of the guide ring 76 is greater than the heights of the substrate support pins 77. Therefore, the guide ring 76 prevents the semiconductor wafer W supported by the substrate support pins 77 from being deviated in the horizontal direction.

Further, as shown in FIG. 2 and FIG. 3, the holding plate 75 of the susceptor 74 has an opening 78 formed to vertically penetrate therethrough. The opening 78 is provided for a radiation thermometer 120 (see FIG. 1) to receive radiation light (infrared light) emitted from the lower surface of the semiconductor wafer W held by the susceptor 74. That is, the radiation thermometer 120 receives through the opening 78 the light emitted from the lower surface of the semiconductor wafer W held by the susceptor 74, and a separately provided detector measures the temperature of the semiconductor wafer W. Further, the holding plate 75 of the susceptor 74 has four through holes 79 through which lift pins 12 (to be described later) of the transfer mechanism 10 can penetrate to transfer the semiconductor wafer W.

Figure 5:
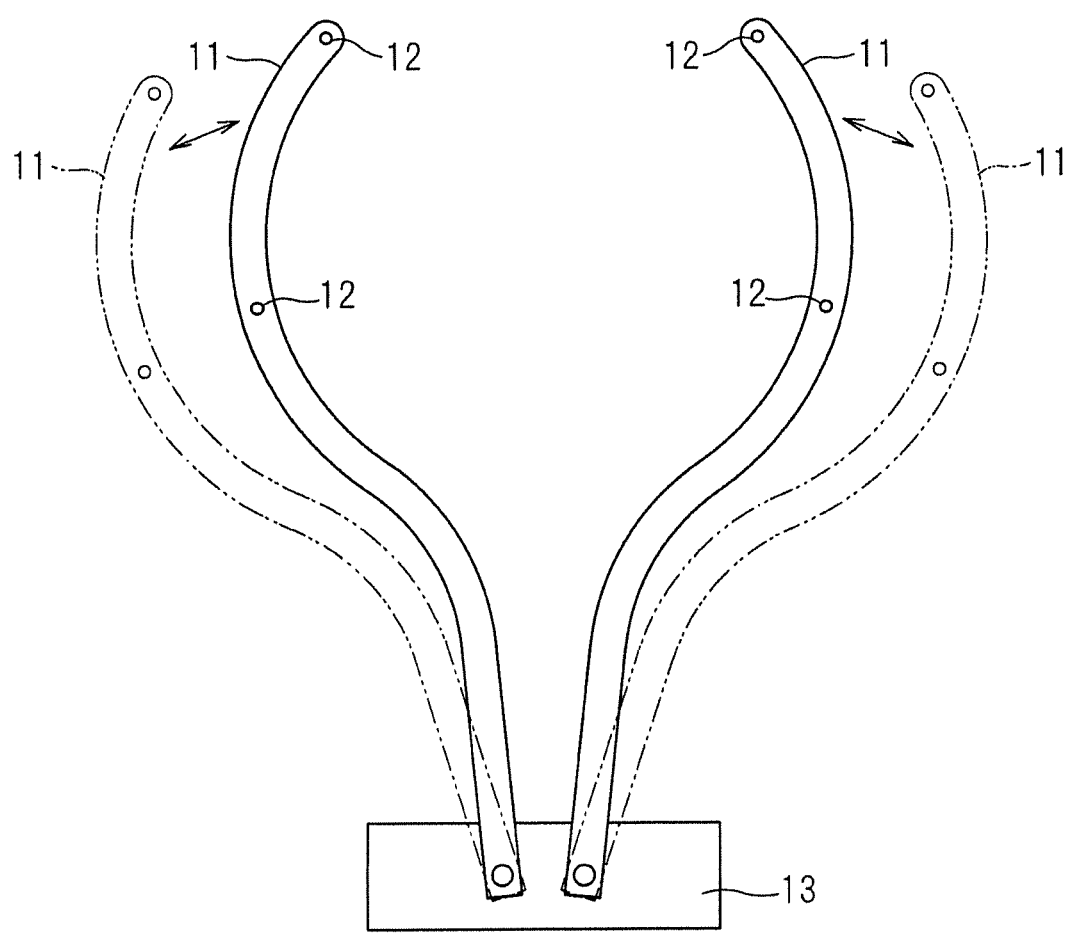
FIG. 5 is a plan view of a transfer mechanism.

FIG. 5 is a plan view of the transfer mechanism 10. Further, FIG. 6 is a side view of the transfer mechanism 10. The transfer mechanism 10 is equipped with two transfer arms 11. The transfer arms 11 each have a circular arc shape which is approximately along the recessed part 62 in a ring shape. Each of the transfer arms 11 has two lift pins 12 provided thereon. Each of the transfer arms 11 can be pivotably moved by a horizontal movement mechanism 13. The horizontal movement mechanism 13 horizontally moves the pair of transfer arms 11 between transfer operation positions (the solid line position in FIG. 5) at which the semiconductor wafer W is transferred to and from the holding member 7, and retreat positions (the two-dot chain line position in FIG. 5) at which the transfer arms 11 do not overlap, in a plan view, with the semiconductor wafer W held by the holding member 7. The horizontal movement mechanism 13 may be made such that each of the transfer arms 11 is pivoted by an individual motor or such that the pair of transfer arms 11 is pivoted by a single motor by using a link mechanism to link the pair of transfer arms 11.

Further, the pair of transfer arms 11 is lifted up and down together with the horizontal movement mechanism 13 by a lift mechanism 14. When the lift mechanism 14 lifts up the pair of transfer arms 11 at the transfer operation positions, the total four lift pins 12 go through the through holes 79 (see FIGS. 2 and 3) provided through the susceptor 74, and the upper ends of the lift pins 12 protrude from the upper surface of the susceptor 74. On the other hand, when the lift mechanism 14 lifts down the pair of transfer arms 11 at the transfer operation positions so as to pull out the lift pins 12 from the through holes 79, and when the horizontal movement mechanism 13 moves the pair of transfer arms 11 so as to open the pair of transfer arms 11, the transfer arms 11 move to the retreat positions. The retreat positions of the pair of transfer arms 11 are right above the base ring 71 of the holding member 7. The base ring 71 is placed on the bottom surface of the recessed part 62; thus, the retreat position of the transfer arms 11 is inside the recessed part 62. Note that, in the vicinity of the part at which a drive unit of the transfer mechanism 10 (the horizontal movement mechanism 13 and the lift mechanism 14), there is provided an exhaust mechanism (not shown), so that the atmosphere in the vicinity of the drive unit of the transfer mechanism 10 is discharged to the outside of the chamber 6.

Referring back to FIG. 1, the flash heating unit 5 provided above the chamber 6 is configured with: a light source constituted by a plurality of xenon flash lamps FL (30 xenon flash lamps in the present preferred embodiment) inside a chassis 51; and a reflector 52 provided so as to cover the light source from above. Further, a lamp light radiation window 53 is mounted on the bottom part of the chassis 51 of the flash heating unit 5. The lamp light radiation window 53 constituting a floor part of the flash heating unit 5 is a plate-shaped quartz window. The flash heating unit 5 is provided above the chamber 6; thus, the lamp light radiation window 53 is opposite to the upper chamber window 63. The flash lamps FL radiates flashing light to the thermal treatment space 65 from above the chamber 6 through the lamp light radiation window 53 and the upper chamber window 63.

The flash lamps FL are each a rod-shaped lamp having a long cylindrical shape and are arranged in a plane such that the longitudinal directions of the flash lamps FL are along the main surface of the semiconductor wafer W held by the holding member 7 (in other words, arranged along the horizontal direction) and are parallel to one another. Therefore, the plane defined by the arranged flash lamps FL is also a horizontal plane.

Figure 8:
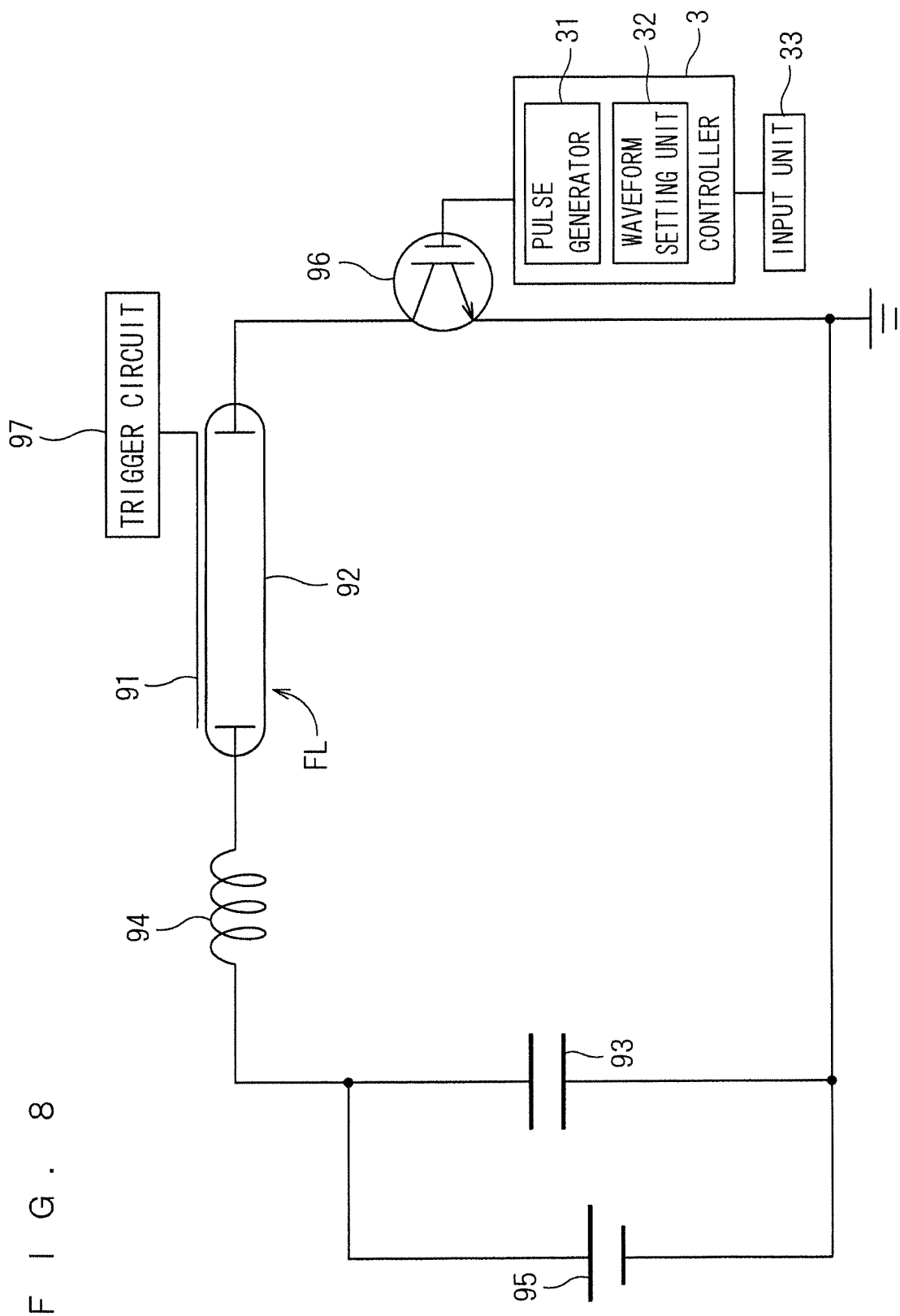
FIG. 8 is a diagram showing a drive circuit of a flash lamp.

FIG. 8 is a diagram showing a drive circuit for a flash lamp FL. As shown in the drawing, a capacitor 93, a coil 94, a flash lamp FL, and an IGBT (Insulation Gate Bipolar Transistor) 96 are connected in series. In addition, as shown in FIG. 8, the controller 3 is equipped with a pulse generator 31 and a waveform setting unit 32 and is connected to an input unit 33. As the input unit 33, there can be employed various known input equipment such as a keyboard, a mouse, or a touch panel. On the basis of a content having been input from the input unit 33, the waveform setting unit 32 sets a waveform of a pulse signal, and the pulse generator 31 generates a pulse signal according to the waveform.

The flash lamp FL is equipped with: a rod-shaped glass tube (discharge tube) 92 which has xenon gas enclosed therein and both end parts of which are each provided with each of an anode and a cathode; and a trigger electrode 91 attached on the outer circumferential surface of the glass tube 92. To the capacitor 93, a predetermined voltage is applied by a power source unit 95, and an electric charge depending on the applied voltage (charging voltage) is charged in the capacitor 93. Further, a high voltage can be applied to the trigger electrode 91 from a trigger circuit 97. A timing at which the trigger circuit 97 applies a voltage to the trigger electrode 91 is controlled by the controller 3.

The IGBT 96 is a bipolar transistor, at a gate part of which a MOSFET (Metal Oxide Semiconductor Field Effect Transistor) is embedded, and is a switching device suitable to deal with a large power. To the gate of the IGBT 96, the pulse signal is applied from the pulse generator 31 of the controller 3. When a voltage (high voltage) higher than a predetermined value is applied to the gate of the IGBT 96, the IGBT 96 turns to an on-state, and when a voltage (Low voltage) lower than the predetermined value is applied to the gate, the IGBT 96 turns to an off-state. As described above, the drive circuit including the flash lamp FL is turned on and off by the IGBT 96. By the IGBTs 96 turning on and off, the connection between the flash lamp FL and the corresponding capacitor 93 are connected and disconnected, so that the current flowing through the flash lamp FL is on-off controlled.

Even if the IGBT 96 turns to an on-state and a high voltage is thus applied across the electrodes on the both ends of the glass tube 92 when the capacitor 93 is charged, electricity does not flow through the glass tube 92 in a normal state because xenon gas is an electric insulator. However, if a high voltage is applied to the trigger electrode 91 by the trigger circuit 97 and the insulation is broken, a current suddenly flows through the glass tube 92 due to the discharge between the electrodes on the both ends, and excited atoms or molecules of xenon at that time emit light.

The drive circuit as shown in FIG. 8 is individually provided to each of the flash lamps FL provided on the flash heating unit 5. In the present preferred embodiment, the 30 flash lamps FL are arranged in a flat plane shape, and 30 drive circuits each as shown in FIG. 8 are provided in correspondence to the 30 flash lamps FL. Therefore, the current flowing through each of the 30 flash lamps FL is individually on-off controlled by the corresponding IGBT 96.

Further, the reflector 52 is provided above the flash lamps FL so as to entirely cover the flash lamps FL. A basic function of the reflector 52 is to reflect the flashing light emitted from the flash lamps FL to the side of the thermal treatment space 65. The reflector 52 is formed of an aluminum alloy plate, and roughening processing is performed on the surface of the reflector 52 (the surface opposing the flash lamps FL) by a blast treatment.

The halogen heating unit 4 provided below the chamber 6 has a plurality (40 in the present preferred embodiment) of halogen lamps HL inside a chassis 41. The halogen heating unit 4 is a light radiation unit and radiates light to the thermal treatment space 65 by a plurality of halogen lamps HL from below the chamber 6 through the lower chamber window 64 so as to heat the semiconductor wafer W.

FIG. 7 is a plan view showing the arrangement of the halogen lamps HL. The 40 halogen lamps HL are separately arranged at upper and lower two levels. At the upper level close to the holding member 7, 20 halogen lamps HL are arranged, and also at the lower level farther from the holding member 7 than the upper level, 20 halogen lamps HL are arranged. Each of the halogen lamps HL is a rod-shaped lamp having a long cylindrical shape. At each of the upper level and the lower level, 20 halogen lamps HL are arranged such that the longitudinal directions of the halogen lamps HL are along the main surface of the semiconductor wafer W held by the holding member 7 (in other words, arranged along the horizontal direction) and are parallel to one another. Therefore, at each of the upper level and the lower level, the flat plane constituted by the arrangement of the halogen lamps HL is a horizontal plane.

Further, as shown in FIG. 7, at each of the upper level and the lower level, the halogen lamps HL are more densely arranged in the area opposite to the peripheral edge part of the semiconductor wafer W held by the holding member 7 than in the area opposite to the central part of the semiconductor wafer W. That is, at each of the upper level and the lower level, a pitch of the arrangement of the halogen lamps HL is smaller at the peripheral edge part of the arrangement of the lamps than at the central part. Therefore, it is possible to radiate a larger amount of light to the peripheral edge part of the semiconductor wafer W, at which the temperature is easily lowered at the time of heating by the light radiation from the halogen heating unit 4.

Further, the group of halogen lamps HL at the upper level and the group of the halogen lamps HL at the lower level are arranged to intersect each other in a lattice manner. The totally 40 halogen lamps HL are arranged such that the longitudinal directions of the 20 halogen lamps HL disposed at the upper level and the longitudinal directions of the 20 halogen lamps HL disposed at the lower level intersect perpendicularly to one another.

Each of the halogen lamps HL is a filament light source and emits light when the filament disposed in the glass tube is energized and thus incandesces. Inside the glass tube, there is enclosed a gas in which a small amount of halogen elements (iodine, bromine, or the like) is introduced into an inert gas such as nitrogen or argon. With halogen elements introduced, it is possible to prevent or reduce breaking of a filament and to set the filament to a high temperature. Therefore, the halogen lamps HL can have a property of having a longer life and continuously radiating more intense light than a normal incandescent light bulb. That is, the halogen lamps HL are continuously lighting lamps which continuously emit light for at least 1 second or longer. Further, the halogen lamps HL are rod-shaped lamps and thus have a longer life, and by arranging the halogen lamps HL along the horizontal direction, an efficiency of radiation to the above semiconductor wafer W is excellent.

Further, also in the chassis 41 of the halogen heating unit 4, a reflector 43 is provided below the two-level halogen lamps HL (FIG. 1). The reflector 43 reflects the light emitted from the halogen lamps HL to the side of the thermal treatment space 65.

The controller 3 controls the above various operation mechanisms provided on the thermal treatment apparatus 1. The controller 3 has, as hardware, the same configuration as that of a common computer. Specifically, the controller 3 is equipped with: a CPU which performs various arithmetic processing; a ROM which is a read only memory and stores a basic program; a RAM which is a read/write capable memory and stores various information; and a magnetic disk which stores control software, data, and the like. The CPU of the controller 3 executes a predetermined processing program, so that the treatment on the thermal treatment apparatus 1 is progressed. Further, the controller 3 is equipped with the pulse generator 31 and the waveform setting unit 32 as shown in FIG. 8. As described above, on the basis of the content having been input from the input unit 33, the waveform setting unit 32 sets the waveform of the pulse signal, and according to the waveform, the pulse generator 31 outputs a pulse signal to the gate of the IGBT 96.

Other than the above configuration, the thermal treatment apparatus 1 is equipped with various cooling structures, which are for preventing or reducing excessive temperature rises on the halogen heating unit 4, the flash heating unit 5, and the chamber 6 caused by thermal energy created by the halogen lamps HL and the flash lamps FL at the time of the thermal treatment of the semiconductor wafer W. For example, a water-cooled tube (not shown) is provided on the wall of the chamber 6. In addition, the halogen heating unit 4 and the flash heating unit 5 are each made to have an air-cooled structure in which a gas flow is created therein to discharge heat. Further, also in the gap between the upper chamber window 63 and the lamp light radiation window 53, air is supplied to cool the flash heating unit 5 and the upper chamber window 63.

Next, a dopant introduction method according to the present invention will be described. In the present preferred embodiment, the semiconductor substrate as a treatment object is a germanium (Ge) semiconductor wafer W. The germanium semiconductor wafer W may be a wafer in which a germanium semiconductor layer is formed on a silicon base material.

First, a silicon dioxide ($SiO_2$) thin film containing a dopant is formed on the front surface of a germanium semiconductor wafer W. FIG. 9 is a diagram schematically showing a surface structure of the semiconductor wafer W on which the silicon dioxide thin film containing a dopant is formed. Before performing a dopant introduction method according to the present invention, a gate electrode 102 is formed on the front surface of the germanium semiconductor wafer W with a gate insulating film 101 therebetween. On each of the areas of a source and a drain positioned on the both sides of the gate electrode 102, a silicon dioxide thin film containing a dopant is formed. The silicon dioxide film containing a dopant in the present preferred embodiment is a PSG (Phosphorus Silicate Glass) film containing phosphorus (P) as a dopant.

The PSG film 21 is formed on the front surface of the semiconductor wafer W by a CVD process by using a gas in which a raw material gas containing phosphorus, for example, is mixed with a gas for forming a silicon dioxide film. The PSG film 21 is formed by a CVD device different from the above thermal treatment apparatus 1.

Next, a thermal treatment is performed by the above thermal treatment apparatus 1 on the semiconductor wafer W on which the PSG film 21 is formed. Hereinafter, the thermal treatment on the semiconductor wafer W by the thermal treatment apparatus 1 will be described. The processing procedure of the thermal treatment apparatus 1 to be described below is progressed by the control of the operation mechanism of the thermal treatment apparatus 1 by the controller 3.

First, the gate valve 185 is opened to open the conveyance opening 66, and a conveyance robot outside the apparatus conveys the semiconductor wafer W into the thermal treatment space 65 of the chamber 6 through the conveyance opening 66. The semiconductor wafer W conveyed in by the conveyance robot advances to the position right above the holding member 7 and stops there. Then the pair of transfer arms 11 of the transfer mechanism 10 horizontally moves from the retreat positions to the transfer operation positions and then goes up, so that the lift pins 12 go through the through holes 79 and protrude from the upper surface of the holding plate 75 of the susceptor 74 to receive the semiconductor wafer W. In this operation, the lift pins 12 go up above the upper end of the substrate support pins 77.

After the semiconductor wafer W is placed on the lift pins 12, the conveyance robot exits from the thermal treatment space 65, and the conveyance opening 66 is closed by the gate valve 185. Then, the pair of transfer arms 11 goes down, so that the semiconductor wafer W is transferred from the transfer mechanism 10 to the susceptor 74 of the holding member 7 and is held from below in a horizontal posture. The semiconductor wafer W is held by the susceptor 74, being supported by the substrate support pins 77 vertically provided on the holding plate 75. Further, the semiconductor wafer W is held by the holding member 7 with the front surface, on which the PSG film 21 is formed, facing upward. Between the back surface (the main surface opposite to the front surface) of the semiconductor wafer W supported by the substrate support pins 77 and the holding surface 75a of the holding plate 75, there is formed a predetermined distance. The pair of transfer arms 11 having gone down below the susceptor 74 is retreated by the horizontal movement mechanism 13 to the retreat position, in other words, the inside of the recessed part 62.

Further, after the conveyance opening 66 is closed by the gate valve 185 and the thermal treatment space 65 thus becomes a sealed space, the atmosphere in the chamber 6 is adjusted. Specifically, the valve 84 is opened to supply a process gas from the gas supply hole 81 to the thermal treatment space 65. In the present preferred embodiment, as the process gas, a mixed gas in which hydrogen gas ($H_2$) is mixed with nitrogen gas ($N_2$) is supplied to the thermal treatment space 65 of the chamber 6. In addition, the valve 89 is opened to discharge the gas in the chamber 6 from the gas exhaust hole 86. By the above operations, the process gas supplied from the upper part of the thermal treatment space 65 of the chamber 6 flows downward and is discharged from the lower part of the thermal treatment space 65; thus, the atmosphere containing hydrogen replaces the gas in the thermal treatment space 65. The atmosphere, containing hydrogen, formed in the thermal treatment space 65 has a hydrogen concentration of about 4 vol %, for example. Further, the valve 192 is opened, and the gas in the chamber 6 is thus discharged also through the conveyance opening 66. In addition, the exhaust mechanism (not shown) discharges the atmosphere around the drive unit of the transfer mechanism 10 as well.

Figure 10:
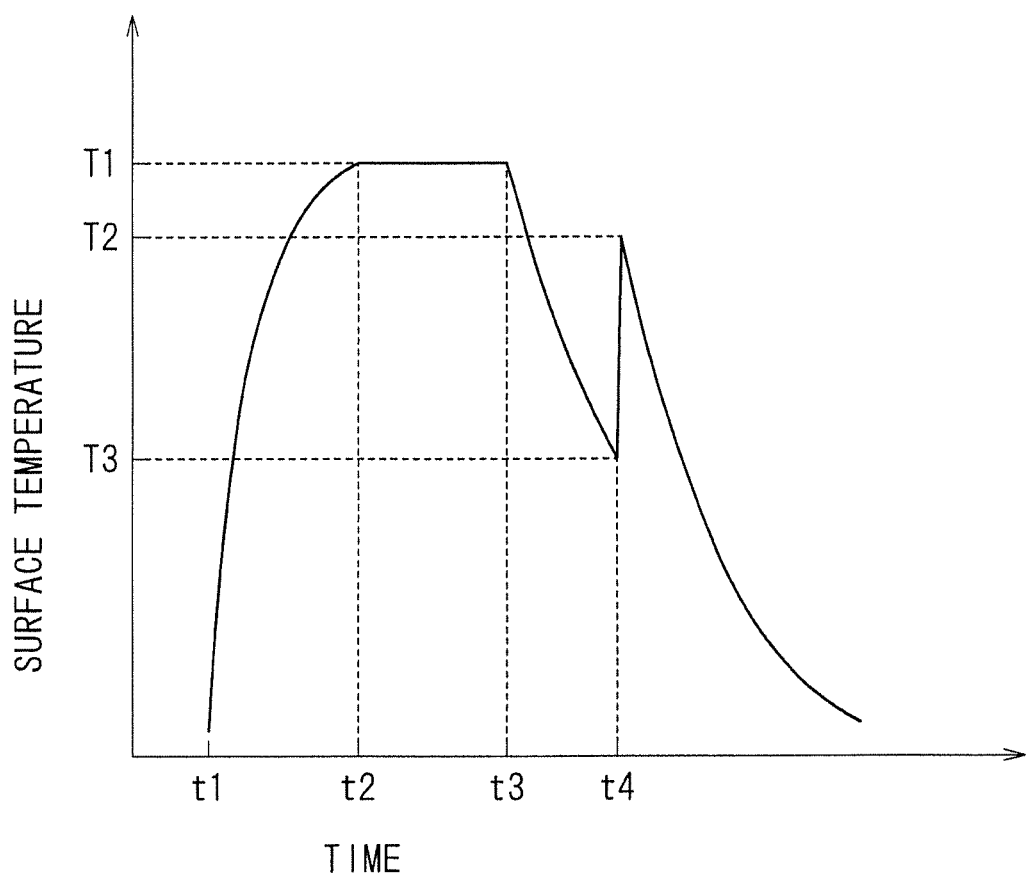
FIG. 10 is a diagram showing a change in a surface temperature of a semiconductor wafer in a first preferred embodiment.

FIG. 10 is a diagram showing a change in a surface temperature of the semiconductor wafer W in the first preferred embodiment. After the gas in the chamber 6 is replaced by the atmosphere containing hydrogen and the semiconductor wafer W is held from below in a horizontal posture by the susceptor 74 of the holding member 7, the 40 halogen lamps HL of the halogen heating unit 4 are concurrently turned on at time t1 to start rapid heating (RTA: Rapid Thermal Annealing) of the semiconductor wafer W. The halogen light emitted from the halogen lamps HL goes through the lower chamber window 64 and the susceptor 74 both made of quartz and is radiated from the back surface side of the semiconductor wafer W. By receiving the light radiation from the halogen lamps HL, the semiconductor wafer W is rapidly heated up, thereby increasing the temperature. Note that the transfer arms 11 of the transfer mechanism 10 are retreated inside the recessed part 62 and therefore do not adversely affect the heating by the halogen lamps HL.

When the rapid heating by the halogen lamps HL is being performed, the temperature of the semiconductor wafer W is being measured by the radiation thermometer 120. Specifically, the radiation thermometer 120 receives through the opening 78 infrared light radiated from the back surface of the semiconductor wafer W held by the susceptor 74 to measure the rising wafer temperature. The measured temperature of the semiconductor wafer W is transferred to the controller 3. The controller 3 controls the output of the halogen lamps HL while monitoring whether or not the temperature of the semiconductor wafer W which is rising in temperature due to the light radiation from halogen lamps HL reaches a predetermined heating temperature T1 (a first temperature). That is, the controller 3 feedback-controls the output of the halogen lamps HL on the basis of the measurement value by the radiation thermometer 120 such that the temperature of the semiconductor wafer W becomes the heating temperature T1. The heating temperature T1 due to the halogen lamps HL is approximately not lower than 500° C. and not higher than 800° C.

After the temperature of the semiconductor wafer W rises up to the heating temperature T1 at time t2, the controller 3 keeps the semiconductor wafer W at the heating temperature T1 for about 4 seconds. Specifically, at time t2 at which the temperature of the semiconductor wafer W measured by the radiation thermometer 120 reaches the heating temperature T1, the controller 3 controls the output of the halogen lamps HL such that the temperature of the semiconductor wafer W is kept approximately at the heating temperature T1.

When being heated by the halogen lamps HL, whole of the semiconductor wafer W is uniformly heated up to the heating temperature T1. In the step of rapid heating by the halogen lamps HL, the temperature tends to be lower at the peripheral edge part of the semiconductor wafer W, at which heat is easily dissipated, than at the central part; however, an arrangement density of the halogen lamps HL of the halogen heating unit 4 is made higher in the area opposite to the peripheral edge part of the semiconductor wafer W than in the area opposite to the central part. With this arrangement, the intensity of the light radiated to the peripheral edge part of the semiconductor wafer W, at which heat is easily dissipated, is increased; therefore, the in-plane temperature distribution of the semiconductor wafer W can be uniform.

Figure 11:
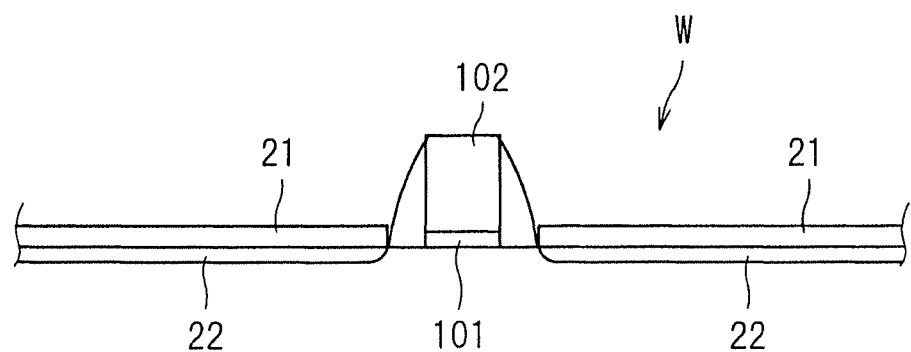
FIG. 11 is a diagram schematically showing a structure of a surface of a semiconductor wafer in which a dopant is introduced.

By keeping the semiconductor wafer W, on the front surface of which the PSG film 21 is formed, at the heating temperature T1 in the atmosphere containing hydrogen for about 4 seconds, phosphorus is diffused into the front surface of the semiconductor wafer W from the PSG film 21. As a result, phosphorus is introduced into the source area and the drain area of the semiconductor wafer W, thereby forming dopant layers. FIG. 11 is a diagram schematically showing a structure of the surface of the semiconductor wafer W in which the dopant is introduced. When the semiconductor wafer W is kept at the heating temperature T1 in the atmosphere containing hydrogen for 1 second or longer, the phosphorus contained in the PSG film 21 is diffused from the boundary surface between the PSG film 21 and the front surface of the semiconductor wafer W into the front surface, so that a dopant layer 22 is formed in the vicinity of the front surface of the semiconductor wafer W.

In the present preferred embodiment, the semiconductor wafer W is heated at the heating temperature T1 in the atmosphere containing hydrogen; therefore, a diffusion coefficient of phosphorus in the PSG film 21 is high. Therefore, by keeping the semiconductor wafer W at the heating temperature T1 for 1 second or longer by the rapid heating by the halogen lamps HL, phosphorus is efficiently diffused from the PSG film 21 into the semiconductor wafer W.

The 40 halogen lamps HL of the halogen heating unit 4 are turned off at time t3 at which about 4 seconds have elapsed since the temperature of the semiconductor wafer W reaches the heating temperature T1 at time t2. When the halogen lamps HL are turned off, the temperature of the semiconductor wafer W drops rapidly from the heating temperature T1. The temperature of the semiconductor wafer W while dropping is measured by the radiation thermometer 120, and the measurement result is transferred to the controller 3. The controller 3 monitors on the basis of the measurement result of the radiation thermometer 120 whether or not the temperature of the semiconductor wafer W drops to a predetermined cooling temperature T3 (a third temperature). Note that the cooling temperature T3 is lower than the heating temperature T1 as a matter of course and is about 300° C. or higher and 400° C. or lower At time t4 at which the temperature of the semiconductor wafer W drops to the cooling temperature T3, flashing light is radiated to the front surface of the semiconductor wafer W from the flash lamps FL of the flash heating unit 5. For flashing light to be radiated by the flash lamps FL, the power source unit 95 previously accumulates electric charge in the capacitor 93. Then, in the state that electric charge is accumulated in the capacitor 93, the pulse signal is output to the IGBT 96 from the pulse generator 31 of the controller 3, so that the IGBT 96 is on-off driven.

The waveform of the pulse signal can be defined by inputting from the input unit 33 a recipe in which a pulse width time (on-time) and a pulse interval time (off-time) are serially set as parameters. When such a recipe is input to the controller 3 from the input unit 33 by an operator, the waveform setting unit 32 of the controller 3 sets, according to the recipe, a pulse waveform in which "on" and "off" are repeated. Then, according to the pulse waveform set by the waveform setting unit 32, the pulse generator 31 outputs the pulse signal. As a result, the pulse signal having the set waveform is applied to the gate of the IGBT 96, so that the on-off drive of the IGBT 96 is controlled. Specifically, when the "on" pulse signal is input to the gate of the IGBT 96, the IGBT 96 becomes an on-state, and when the "off" pulse signal is input, the IGBT 96 becomes an off-state.

Further, in synchronism with the timing at which the pulse signal output from the pulse generator 31 becomes "on", the controller 3 controls the trigger circuit 97 such that a high voltage (trigger voltage) is applied to the trigger electrode 91. If the pulse signal is input to the gate of the IGBT 96 in the state that electric charge is accumulated in the capacitor 93, and if the high voltage is applied to the trigger electrode 91 in synchronism with the timing when the pulse signal becomes "on", a current flows between the electrodes on the both ends in the glass tube 92 without fail when the pulse signal is "on", and light is emitted due to the atoms or molecules of xenon excited when the current flows.

As described above, the 30 flash lamps FL of the flash heating unit 5 emit light, and the flashing light is radiated to the front surface of the semiconductor wafer W held by the holding member 7. If the flash lamps FL are made to emit light without using the IGBTs 96, the electric charges accumulated in the capacitors 93 are consumed for a single light emission, and the output waveform from the flash lamps FL is a simple single pulse having a width of about 0.1 ms to 10 ms. In contrast, in the present preferred embodiment, by connecting the IGBTs 96 as switching devices in the circuits and by outputting pulse signals to the gates of the IGBTs 96, the supply of electric charges from the capacitors 93 to the flash lamps FL is interrupted by the IGBTs 96 so as to on-off control the currents flowing through the flash lamps FL. As a result, the light emission of the flash lamps FL is subjected to so-called chopper control, and the electric charges accumulated in the capacitors 93 are consumed intermittently so that the flash lamps FL are repeatedly turned on and off for a very short time. Note that before the values of the currents flowing through the circuits become completely zero, the next pulses are applied to the gates of the IGBTs 96, and the current values increases again; thus, the light emission output does not become completely zero while the flash lamps FL are repeatedly turned on and off.

By on-off controlling the currents flowing through the flash lamps FL by the IGBTs 96, a light emission pattern of the flash lamps FL (temporal waveform of the light emission output) can be arbitrarily defined; thus, the light emission time and the light emission intensity can be arbitrarily adjusted. The pattern of the on-off drive of the IGBTs 96 is defined by a pulse width time and a pulse interval time input from the input unit 33. That is, since the IGBTs 96 are embedded in the drive circuits of the flash lamps FL, it is possible to arbitrarily define the light emission pattern of the flash lamps FL only by appropriately setting the pulse width time and the pulse interval time to be input from the input unit 33.

Specifically, for example, if the ratio of the pulse width time to the pulse interval time to be input from the input unit 33 is increased, the currents flowing through flash lamps FL are increased, so that the light emission intensity is increased. To the contrary, if the ratio of the pulse width time to the pulse interval time to be input from the input unit 33 is decreased, the currents flowing through the flash lamps FL are decreased, so that the light emission intensity is decreased. Further, if the ratio between the pulse interval time and the pulse width time to be input from the input unit 33 is appropriately adjusted, the light emission intensity of the flash lamps FL can be kept constant. Further, when the total time of the combination of the pulse width time and the pulse interval time to be input to the input unit 33 is made long, the currents keep flowing through the flash lamps FL for a relatively long time, and the light emission time of the flash lamps FL is accordingly long. In the present preferred embodiment, the light emission time of the flash lamps FL is set between 0.1 ms and 100 ms.

As described above, flashing light is radiated from the flash lamps FL to the front surface of the semiconductor wafer W for a radiation time of 0.1 ms or longer and 100 ms or shorter to perform the flash heating of the semiconductor wafer W. The extremely short and strong flashing light whose radiation time is 0.1 ms or longer and 100 ms or shorter is radiated, so that the front surface of the semiconductor wafer W including the PSG film 21 is heated instantaneously up to the target temperature T2 (the second temperature). In the first preferred embodiment, the target temperature T2 at the time of flash heating is lower than the heating temperature T1 at the time of rapid heating by the halogen lamps HL and is higher than the cooling temperature T3.

By radiating the flashing light to the semiconductor wafer W in the atmosphere containing hydrogen for the radiation time of 0.1 ms or longer and 100 ms or shorter so as to instantaneously heat the front surface of the semiconductor wafer W to the target temperature T2, the phosphorus in the dopant layer 22 formed in the source area and the drain area of the semiconductor wafer W is activated. Further, by heating the semiconductor wafer W to the target temperature T2 in the atmosphere containing hydrogen, the phosphorus is slightly diffused into the front surface of the semiconductor wafer W from the PSG film 21 also at the time of the flash heating.

In the flash heating, the radiation time of the flashing light is an extremely short time not longer than 1 second; therefore, the front surface temperature of the semiconductor wafer W instantaneously rises up to the target temperature T2 and the rapidly drops. The temperature of the semiconductor wafer W which is dropping in temperature is measured by the radiation thermometer 120, and the measurement result is transferred to the controller 3. On the basis of the measurement result of the radiation thermometer 120, the controller 3 monitors whether or not the temperature of the semiconductor wafer W drops down to a predetermined temperature. Further, after the completion of the flash heating, only a nitrogen gas is supplied into the chamber 6, so that a nitrogen atmosphere replaces the gas in the thermal treatment space 65. Then, after the temperature of the semiconductor wafer W drops to or lower than a predetermined temperature, the pair of transfer arms 11 of the transfer mechanism 10 horizontally moves from the retreat positions to the transfer operation positions and then rises again; thus, the lift pins 12 protrude from the upper surface of the susceptor 74 to receive the semiconductor wafer W after the thermal treatment from the susceptor 74. Subsequently, the conveyance opening 66 closed by the gate valve 185 is opened, and the semiconductor wafer W placed on the lift pins 12 is conveyed out by the conveyance robot outside the apparatus, which operation completes the thermal treatment of the semiconductor wafer W in the thermal treatment apparatus 1. The PSG film 21 may be removed from the front surface of the semiconductor wafer W after the completion of the thermal treatment of the semiconductor wafer W in the thermal treatment apparatus 1.

In the first preferred embodiment, the semiconductor wafer W, on the front surface of which the PSG film 21 is formed, is kept at the heating temperature T1 in the atmosphere containing hydrogen for 1 second or longer, so that the dopant is diffused from the PSG film 21 into the front surface of the semiconductor wafer W. In addition, the flashing light is radiated to the semiconductor wafer W for the radiation time shorter than 1 second to heat the front surface of the semiconductor wafer W to the target temperature T2 so as to activate the dopant. When the PSG film 21 is heated in the atmosphere containing hydrogen, a diffusion coefficient of the dopant contained in the PSG film 21 is high; therefore, the dopant can be efficiently diffused from the PSG film 21 into the semiconductor wafer W and can be efficiently activated.

In addition, in the first preferred embodiment, after the semiconductor wafer W is kept at the heating temperature T1 for about 4 seconds by the halogen lamps HL, the halogen lamps HL are turned off to once lower the temperature of the semiconductor wafer W to the cooling temperature T3 prior to the radiation of the flashing light. As a result, the thermal budget of whole of the thermal treatment processing of the semiconductor wafer W in the thermal treatment apparatus 1 is small, and the dopant can be thus prevented from being excessively diffused into the semiconductor substrate W when the flash light is radiated.

Second Preferred Embodiment

Next, a second preferred embodiment of the present invention will be described. A general structure of a thermal treatment apparatus 1 of the second preferred embodiment is identical to that of the first preferred embodiment. Further, a processing procedure of the semiconductor wafer W in the thermal treatment apparatus 1 of the second preferred embodiment is also approximately identical to that of the first preferred embodiment. The difference of the second preferred embodiment from the first preferred embodiment is a relationship of height between the heating temperature T1 by the halogen lamps HL and the target temperature T2 at the time of the irradiation of flashing light.

Figure 12:
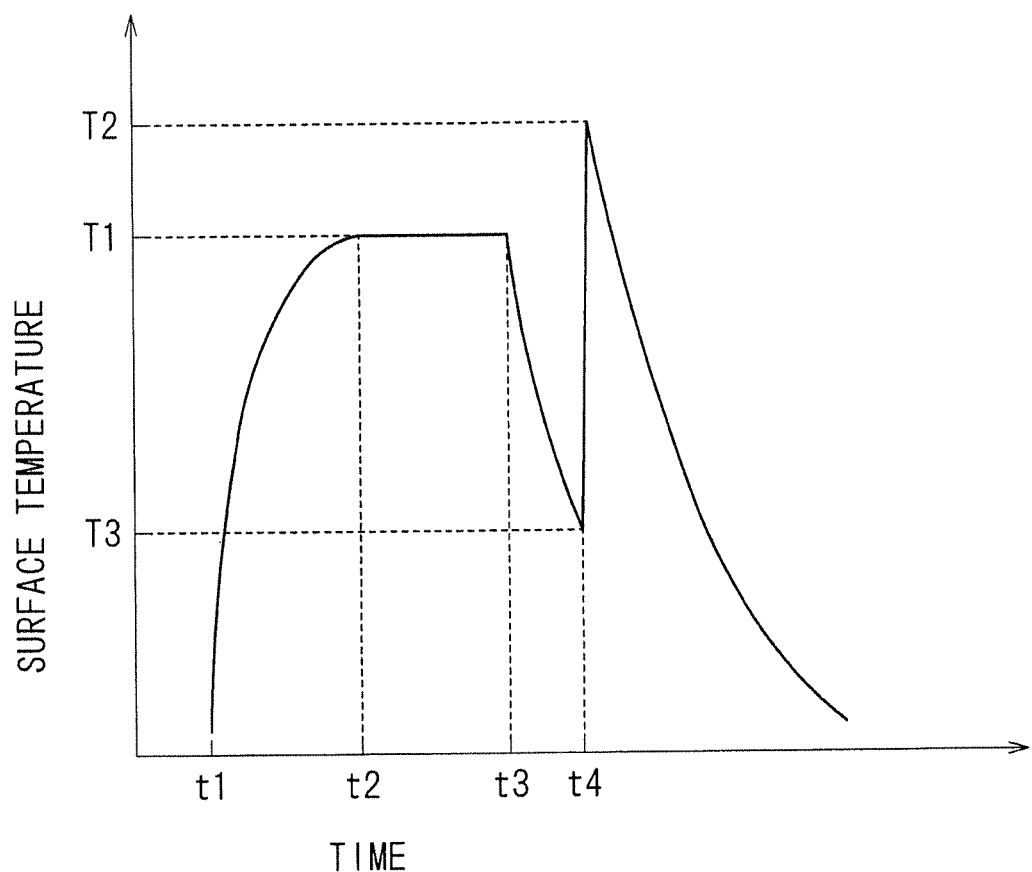
FIG. 12 is a diagram showing a change in surface temperature of a semiconductor wafer in a second preferred embodiment.

FIG. 12 is a diagram showing a change in the surface temperature of the semiconductor wafer W in the second preferred embodiment. Similarly to the first preferred embodiment, the 40 halogen lamps HL are turned on at time t1 to start rapid heating of the semiconductor wafer W. After the temperature of the semiconductor wafer W reaches the heating temperature T1 at time t2, the temperature of the semiconductor wafer W is kept at the heating temperature T1 for about 4 seconds by the radiation of light from the halogen lamps HL. By keeping the semiconductor wafer W, on which the PSG film 21 is formed, at the heating temperature T1 in the atmosphere containing hydrogen for 1 second or longer, the phosphorus is diffused from the PSG film 21 into the front surface of the semiconductor wafer W.

Subsequently, at time t3 at which about 4 seconds have elapsed since the temperature of the semiconductor wafer W reaches the heating temperature T1, the 40 halogen lamps HL are turned off, and the temperature of the semiconductor wafer W drops rapidly from the heating temperature T1. Then, at time t4 at which the temperature of the semiconductor wafer W drops down to a cooling temperature T3, flashing light is radiated from the flash lamps FL of the flash heating unit 5 to the front surface of the semiconductor wafer W. By radiating the flashing light from the flash lamps FL to the front surface of the semiconductor wafer W for a radiation time of 0.1 ms or longer and 100 ms or shorter, the front surface of the semiconductor wafer W is heated instantaneously up to the target temperature T2. In the second preferred embodiment, the flash lamps FL have a stronger light emission intensity than in the first preferred embodiment, and the target temperature T2 at the time of the flash heating is higher than the heating temperature T1 at the time of the rapid heating by halogen lamps HL. By radiating flashing light to a semiconductor wafer W for a radiation time not longer than 1 second in an atmosphere containing hydrogen and by instantaneously heating the front surface of the semiconductor wafer W up to the target temperature T2, phosphorus diffused in the front surface of the semiconductor wafer W is activated.

Also in the second preferred embodiment, the semiconductor wafer W, on the front surface of which the PSG film 21 is formed, is kept at the heating temperature T1 in the atmosphere containing hydrogen for 1 second or longer, so that the dopant is diffused from the PSG film 21 into the front surface of the semiconductor wafer W. In addition, the flashing light is radiated to the semiconductor wafer W for the radiation time shorter than 1 second to heat the front surface of the semiconductor wafer W to the target temperature T2 so as to activate the dopant. Therefore, similarly to the first preferred embodiment, the dopant can be efficiently diffused from the PSG film 21 into the semiconductor wafer W and can be efficiently activated.

In addition, after the semiconductor wafer W is kept at the heating temperature T1 for about 4 seconds by the halogen lamps HL, the halogen lamps HL are turned off to once lower the temperature of the semiconductor wafer W to the cooling temperature T3 prior to the radiation of the flashing light. Therefore, similarly to the first preferred embodiment, the thermal budget of whole of the thermal treatment processing of the semiconductor wafer W in the thermal treatment apparatus 1 is small, and the dopant can be thus prevented from being excessively diffused into the semiconductor substrate W when the flash light is radiated.

Third Preferred Embodiment

Next, a third preferred embodiment of the present invention will be described. A general structure of a thermal treatment apparatus 1 of the third preferred embodiment is identical to that of the first preferred embodiment. Further, a processing procedure of the semiconductor wafer W in the thermal treatment apparatus 1 of the third preferred embodiment is also approximately identical to that of the first preferred embodiment. The difference of the third preferred embodiment from the first preferred embodiment is that the temperature of the semiconductor wafer W is not lowered before the radiation of the flashing light.

FIG. 13 is a diagram showing a change in the surface temperature of the semiconductor wafer W in the third preferred embodiment. Similarly to the first preferred embodiment, the 40 halogen lamps HL are turned on at time t1 to start rapid heating of the semiconductor wafer W. After the temperature of the semiconductor wafer W reaches the heating temperature T1 at time t2, the temperature of the semiconductor wafer W is kept at the heating temperature T1 for about 4 seconds by the radiation of light from the halogen lamps HL. By keeping the semiconductor wafer W, on which the PSG film 21 is formed, at the heating temperature T1 in the atmosphere containing hydrogen for 1 second or longer, the phosphorus is diffused from the PSG film 21 into the front surface of the semiconductor wafer W.

Subsequently, in the third preferred embodiment, the halogen lamps HL are turned off at time t4 at which about 4 seconds have elapsed after the temperature of the semiconductor wafer W reaches the heating temperature T1, and at the same time, flashing light is radiated from the flash lamps FL of the flash heating unit 5 to the front surface of the semiconductor wafer W. By radiating the flashing light from the flash lamps FL to the front surface of the semiconductor wafer W for a radiation time of 0.1 ms or longer and 100 ms or shorter, the front surface of the semiconductor wafer W is heated instantaneously up to the target temperature T2. That is, in the third preferred embodiment, the temperature of the semiconductor wafer W is not lowered before the radiation of the flashing light, and the surface of the semiconductor wafer W is raised from the heating temperature T1 directly to the target temperature T2. By radiating flashing light to a semiconductor wafer W for a radiation time not longer than 1 second in an atmosphere containing hydrogen and by instantaneously heating the front surface of the semiconductor wafer W up to the target temperature T2, phosphorus diffused in the front surface of the semiconductor wafer W is activated.

Also in the third preferred embodiment, the semiconductor wafer W, on the front surface of which the PSG film 21 is formed, is kept at the heating temperature T1 in the atmosphere containing hydrogen for 1 second or longer, so that the dopant is diffused from the PSG film 21 into the front surface of the semiconductor wafer W. In addition, the flashing light is radiated to the semiconductor wafer W for the radiation time shorter than 1 second to heat the front surface of the semiconductor wafer W to the target temperature T2 so as to activate the dopant. Therefore, similarly to the first preferred embodiment, the dopant can be efficiently diffused from the PSG film 21 into the semiconductor wafer W and can be efficiently activated.

In addition, in the third preferred embodiment, the temperature of the semiconductor wafer W is not lowered before the radiation of the flashing light; therefore, it is possible to shorten a processing time of whole of the thermal treatment processing of the semiconductor wafer W in the thermal treatment apparatus 1.

Modified Examples

The preferred embodiments of the present invention are described above; however, the present invention can be modified in various ways other than those described above without departing from the spirit of the invention. For example, the PSG film 21 is formed as a silicon dioxide film containing a dopant in the above preferred embodiments; however, instead of the PSG film 21, a BSG (Boron Silicate Glass) film containing boron (B) as a dopant may be formed on the front surface of the semiconductor wafer W.

Further, the thermal treatment pattern for the semiconductor wafer W is not limited to the patterns in the first preferred embodiment to the third preferred embodiment, and a pattern can be used in which the semiconductor wafer W is kept at the heating temperature T1 in the atmosphere containing hydrogen for 1 second or longer and then flashing light is radiated to the semiconductor wafer W for the radiation time shorter than 1 second so as to heat the front surface of the semiconductor wafer W up to the target temperature T2

Further, the atmosphere containing hydrogen is not limited to the atmosphere of a mixed gas in which hydrogen gas is mixed with nitrogen gas, and an atmosphere of a mixed gas containing hydrogen gas and another gas, or an atmosphere of pure hydrogen gas can be used. Further, the atmosphere containing hydrogen is only required to contain at least hydrogen atoms, and an atmosphere may contain ammonia gas ($NH_3$), for example.

Further, in the above preferred embodiments, the semiconductor substrate as a treatment object is a germanium semiconductor wafer W; however, the semiconductor substrate is not limited to a germanium semiconductor wafer W. The semiconductor substrate as a treatment object may be a silicon (Si) or silicon-germanium (SiGe) semiconductor wafer W.

Further, in the above preferred embodiments, the flash heating unit 5 is equipped with 30 flash lamps FL; however, the number of flash lamps FL is not limited to 30, and any number of flash lamps FL may be equipped. Further, the flash lamps FL do not have to be xenon flash lamps, and krypton flash lamps may be used. Further, the number of the halogen lamps HL equipped on the halogen heating unit 4 is not limited to 40 but can be any number.

Further, in the above preferred embodiments, the semiconductor wafer W is heated to the heating temperature T1, and kept at the heating temperature T1 for about 4 seconds by the filament halogen lamps HL as the continuously lighting lamps which continuously emit light for at least 1 second or longer, but the lamps are not limited to the halogen lamps HL, and arc lamps, such as discharge xenon arc lamps, may be used as similar continuously lighting lamps in place of the halogen lamps HL to heat the semiconductor wafer W in a similar manner.

While the invention has been shown and described in detail, the foregoing description is in all aspects illustrative and not restrictive. It is therefore understood that numerous modifications and variations can be devised without departing from the scope of the invention.

What is claimed is:

1. A dopant introduction method in which a dopant is introduced into a semiconductor substrate and is activated, the method comprising the steps of:
    (a) forming on a surface of a semiconductor substrate a silicon dioxide film containing a dopant;
    (b) keeping said semiconductor substrate at a first temperature in an atmosphere containing hydrogen atoms for 1 second or longer to diffuse said dopant into a surface of said semiconductor substrate from said silicon dioxide film containing said dopant; and
    (c) irradiating in said atmosphere containing hydrogen atoms said semiconductor substrate with flashing light for a radiation time less than 1 second to heat the surface of said semiconductor substrate at a second temperature to activate said dopant, wherein
    after said step (b) is performed, said semiconductor substrate is cooled to a third temperature lower than said first temperature, and then said step (c) is performed, and
    said second temperature is lower than said first temperature.

2. The dopant introduction method according to claim 1, wherein said silicon dioxide film containing said dopant is a PSG film or a BSG film.

3. The dopant introduction method according to claim 1, wherein said atmosphere containing hydrogen atoms is an atmosphere of a mixed gas in which hydrogen gas is mixed with nitrogen gas.

4. A thermal treatment method for a semiconductor substrate, the method comprising the steps of:
    (a) keeping a semiconductor substrate, on a surface of which a silicon dioxide film containing a dopant is formed, in an atmosphere containing hydrogen atoms at a first temperature for 1 second or longer to diffuse said dopant into said surface of said semiconductor substrate from said silicon dioxide film; and
    (b) irradiating, in said atmosphere containing hydrogen atoms, said semiconductor substrate with flashing light for a radiation time less than 1 second to heat the surface of said semiconductor substrate at a second temperature to activate said dopant, wherein
    after said step (a) is performed, said semiconductor substrate is cooled to a third temperature lower than said first temperature, and then said step (b) is performed, and
    said second temperature is lower than said first temperature.

* * * * *